United States Patent
Beetz, Jr. et al.

(10) Patent No.: US 6,750,153 B2
(45) Date of Patent: Jun. 15, 2004

(54) PROCESS FOR PRODUCING MACROSCOPIC CAVITIES BENEATH THE SURFACE OF A SILICON WAFER

(75) Inventors: Charles P. Beetz, Jr., Southbury, CT (US); Robert W. Boerstler, Woodbury, CT (US)

(73) Assignee: NanoSciences Corporation, Oxford, CT (US)

( * ) Notice: Subject to any disclaimer, the term of this patent is extended or adjusted under 35 U.S.C. 154(b) by 24 days.

(21) Appl. No.: 10/001,358

(22) Filed: Oct. 24, 2001

(65) Prior Publication Data

US 2002/0086551 A1 Jul. 4, 2002

Related U.S. Application Data

(60) Provisional application No. 60/242,726, filed on Oct. 24, 2000.

(51) Int. Cl.$^7$ ................................................. H01L 21/302
(52) U.S. Cl. ..................... 438/745; 438/749; 438/750; 438/753
(58) Field of Search ................................. 438/745, 753, 438/750, 749; 216/99; 205/640, 647, 660, 664, 674

(56) References Cited

U.S. PATENT DOCUMENTS

| | | |
|---|---|---|
| 4,874,484 A | 10/1989 | Foell et al. |
| 5,348,627 A | 9/1994 | Propst et al. |
| 5,431,766 A | 7/1995 | Propst et al. |
| 5,544,772 A | 8/1996 | Soave et al. |
| 5,997,713 A | 12/1999 | Beetz, Jr. et al. |

FOREIGN PATENT DOCUMENTS

DE 3324232 A1 1/1985

OTHER PUBLICATIONS

The Physics of Macropore Formation in Low Doped n–Type Silicon, V. Lehmann, J. Electrochem. Soc., vol. 140, No. 10, Oct. 1993, The Electrochemical Society, Inc.
Properties of Silicon–Electrolyte Junctions and Their Application to Silicon Characterization. H. Foll, Appl. Phys. A 53, 8–19 (1991).
A New Capacitor Technology Based on Porous Silicon, V. Lehmann et al., Nov. 1995, Solid State Technology, pp. 99, 100, 102.
The Physics of Macroporous Silicon Formation, V. Lehmann, Thin Solid Films 255 (1995) 1–4.
High Aspect Ratio Submicron Silicon Pillars Fabricated by Photoassisted Electrochemical Etching and Oxidation, J.W. Lau and G.J. Parker, 1995, American Institute of Physics.
The Photoelectrochemical Oxidation of n–Si in Anhydrous HF–Acetonitrile, Eric Propst and Paul A. Kohl, J. Electrochem. Soc., vol. 140, No. 5, May 1993.
Processing of Three–Dimensional Microstructures Using Macroporous n–Type Silicon, Ottow et al., J. Electrochem. Soc., vol. 143, No. 1, Jan. 1996.
The Electrochemical Oxidation of Silicon and Formation of Porous Silicon in Acetonitrile, E. Propst and Paul Kohl, J. Electrochem. Soc., vol. 141, No. 4, Apr. 1994.
Microfabrication of Silicon Via Photoetching, The Electrochemical Society Proceedings, vol. 94–32, pp. 350–361.
Formation Mechanism and Properties of Electrochemically Etched Trenches in n–Type Silicon, V. Lehmann and H. Foll, J. Electrochem. Soc., vol. 137, No. 2, Feb. 1990.

*Primary Examiner*—Nadine G. Norton
*Assistant Examiner*—Duy-Vu Deo
(74) *Attorney, Agent, or Firm*—Lerner, David, Littenberg, Krumholz & Mentlik, LLP

(57) ABSTRACT

A silicon element having macrocavities beneath its exterior surface is fabricated by electrochemical etching of a p-type silicon wafer. Etching at a high current density results in the formation of deep macrocavities overhung by a layer of crystalline silicon. The process works with both aqueous and non-aqueous electrolytes.

41 Claims, 2 Drawing Sheets

PROCESS FOR PRODUCING MACROSCOPIC CAVITIES BENEATH THE SURFACE OF A SILICON WAFER

CROSS-REFERENCE TO RELATED APPLICATIONS

The present application claims benefit of U.S. Provisional Patent Application 60/242,726, filed Oct. 24, 2000, the disclosure of which is incorporated by reference herein.

BACKGROUND OF THE INVENTION

The present invention relates to processes for etching silicon to form macroscopic cavities within the interior of a silicon wafer, each cavity having at least one opening connecting to the exterior surface of the wafer.

A number of references teach the electrolytic etching of silicon in acidic solutions. For example, German Patent No. 3,324,232 to Foll et al. teaches an etching process whereby a number of honeycomb pattern of open cells are formed in the surface of a silicon wafer, thereby increasing its effective surface area.

U.S. Pat. No. 5,544,772 to Soave et al. proposes the fabrication of microchannel plate devices by light-assisted electrochemical etching of n-type <100> silicon. The light-assisted electrochemical etching process described in the '772 patent is applied only to n-type silicon, and a light source is required to generate surface charges so that etching may proceed.

As described, for example, in Lehmann et al., Formation Mechanism and Properties of Electrochemically Etched Trenches in N-Type Silicon, J. Electrochemical Society, Vol. 1–7, No. 2, pp. 653–659 (1990) and in U.S. Pat. No. 4,874,484, light-assisted electrochemical etching of n-type silicon produces deep channels perpendicular to the surface of the silicon. If the silicon surface is provided with pits at preselected locations, the channels form at the pits and hence at the same preselected locations. As described in these references, and in numerous other references, it has long been believed that the mechanism responsible for such selective etching limited its application to n-type silicon.

U.S. Pat. No. 5,997,713 to Beetz, Jr. et al. disclosed the successful application of controlled deep-channel etching to p-type silicon. In processes disclosed in the '713 patent, the silicon surface is provided with pits at preselected locations with the result that channels are etched into the silicon body at the same preselected locations as the pits.

Propst et al., The Electrochemical Oxidation of Silicon and Formation of Porous Silicon in Acetonitrile, J. Electrochemical Society, Vol. 141, No. 4, pp. 1006–1013 (1994), discloses the formation of deep channels at random locations in a p-type silicon body using electrochemical etching with a non-aqueous, anhydrous electrolyte. This reference does not disclose processes for etching channels at preselected locations. Moreover, this reference emphasizes that the use of aqueous electrolytes results in formation of highly branched, porous structures rather than trenches, cavities or other non-branched deep structures. Similar teachings are found in Rieger et al., Microfabrication of Silicon by Photo Etching, The Electrochemical Society Proceedings, Vol. 94–361 (1994). U.S. Pat. Nos. 5,348,627 and 5,431,776 to Propst et al. relate to this same work.

Despite these and other efforts in the art, substantial needs remain for further improvements in processes for forming buried cavities in silicon elements. It would be desirable to provide a process for forming cavities in p-type silicon at preselected locations. P-type silicon wafers are fabricated in large numbers for use in manufacture of conventional silicon semiconductor devices. Therefore, p-type wafers are readily available at low cost.

It would be particularly desirable to produce silicon elements having a number of macroscopic cavities beneath the surface of the silicon element wherein the cavities are covered by a layer of monocrystalline silicon near an exterior surface of the element. Structures having a monocrystalline region overhanging a cavity would be desirable in standard silicon device processing to produce active and passive microelectronic structures. It is not possible to produce such structures using a single-etching process by the state-of-the-art processing methods described above. While it is possible to make such overhung cavities by combinations of standard processing methods and wafer bonding, these approaches are less efficient than a single-etching process would be, because they require additional processing time, equipment and materials.

Applications such as high-speed radio frequency (RF) electronics, e.g., those used in cellular communications, require microelectronic devices having silicon layers that are electrically isolated from the bulk wafer substrate. It is desirable, but not possible in current practice, to produce such layers by removing material between the silicon layer and the bulk of the wafer in a single process. Moreover, it is desirable to produce thin layers of silicon oxide, as could be produced by etching macrocavities beneath a layer of crystalline silicon, then subjecting the remaining silicon to thermal treatment in an oxygenated environment. Such layers can be produced, at present, by SIMOX processing where oxygen atoms are injected individually beneath the surface of a silicon body, but the silicon body is subject to radiation damage that is intrinsic to the SIMOX process.

Other technologies, such as inkjet printing, slow-release drug delivery systems, and miniature reagent supply/storage reservoirs for "lab-on-a-chip" chemical analysis systems require a plurality of precisely placed reservoirs on a single chip. Under current techniques, such reservoirs are produced by etching wafers of diverse materials and bonding them to each other. It is desirable to produce such structures by a single process.

The processes used to etch voids in silicon heretofore have operated at relatively low etch rates, so that the dimensions of the voids increase at less than 1 $\mu$m per minute. It would be desirable to form cavities at a faster rate to reduce the cost of the process.

Moreover, processes which require anhydrous electrolytes incur additional costs due to the precautions that must be taken to eliminate water from the solvents and to isolate the process from moisture in the environment. These processes incur further costs associated with purchase and disposal of the required organic solvents. It would be desirable to eliminate these costs by providing an aqueous etching method.

SUMMARY OF THE INVENTION

A method according to a preferred aspect of the invention begins with providing a p-doped silicon element having front and back surfaces. The method further includes the steps of forming a plurality of pits at preselected locations on the front surface of the element and subjecting the pitted silicon element to electrochemical etching. In the electrochemical etching procedure, the front surface of the element and a counter-electrode are maintained in contact with an electrolyte while maintaining the silicon element at a positive potential with respect to the counter-electrode. A patterned electrode provides electrical contact at the back surface of the element within discrete regions which are aligned with the pits of the front surface. The element is etched preferentially at the pits to form cavities beneath the wafer surface. The silicon body is maintained at a positive potential relative to the counter-electrode, and the electrochemical cell is operated at a constant current density throughout the etching process. Preferably, the current density is maintained at a value on the order of twenty times as large as the current densities typically used to etch p-type silicon. More preferably, the current density is maintained at a value between 0.05 and 0.9 amps/cm$^2$, most preferably at a value of about 0.4 amps/cm$^2$. As cell impedance decreases, the voltage is allowed to decrease so that the current density is maintained near a constant value.

The term "p-doped silicon" as used in this disclosure refers to silicon having an appreciable quantity of p-type dopants such as B, Al and Ga, which tend to form positively charged sites, commonly referred to as holes in the silicon crystal lattice. Desirably, the silicon element contains at least about $10^{14}$ and more preferably at least about $10^{15}$ atoms of p-type dopants per cubic centimeter. The silicon element therefore has an appreciable number of holes in the silicon crystal lattice. The p-type material may optionally include some n-type dopants as well as the p-type dopants, and its electrical characteristics may be p-type, n-type or compensated. Most typically, the material is doped only with p-type dopants, or with an excess of p-type dopants over n-type dopants, and hence exhibits p-type electrical conductivity with holes as the majority carriers.

This aspect of the present invention incorporates the discovery that when a p-doped silicon body is provided with pits at preselected locations in its exposed surface, electrochemical etching will proceed at these preselected locations. Most preferably, the silicon element is substantially monocrystalline silicon, such as a wafer of the type commonly used in a semi-conductor fabrication or a portion cut from such a wafer. Desirably, the exposed surface of the silicon element is a <100> surface of the crystal.

According to a particularly preferred aspect of the invention, the electrolyte is an aqueous electrolyte which includes fluoride ions and a surfactant. The aqueous electrolyte desirably has a pH of about 1 to about 4, more desirably about 2 to about 4 and most desirably about 3 to about 4. Most desirably, the electrolyte includes an acid other than hydrofluouric and a fluoride salt as a source of fluoride ions. Whether the fluoride ions are added as HF or as salt, the resulting electrolyte contains some HF. The aqueous electrolyte desirably has an HF concentration at least 0.25 M and more desirably between about 0.25 M and 10 M. HF concentrations of about 1.5 M to about 2 M are most preferred. Inorganic acids and salts are preferred. For example, the electrolyte may include HCl and NH$_4$F. This preferred aspect of the present invention incorporates the realization that the teachings of the art, to the effect that etching of the p-type silicon with an aqueous electrolyte will result only in a branched microporous structure, are incorrect.

The most preferred processes do not require either the expense of anhydrous processing or the expense and hazards associated with handling and storing liquid HF as a starting reagent.

Methods according to the foregoing aspect of the present invention can be used to fabricate structures with numerous macrocavities buried within p-type silicon elements. The cavities can be placed at any desired locations on the silicon element. Etching p-doped monocrystalline silicon according to the preferred processes of the invention produces macroscopic cavities buried within the body with a uniform layer of crystalline silicon overlying the macrocavity. The thickness of the layer can be controlled by the initial diameter of the pits etched into the front surface of the silicon element. The use of particularly preferred etching processes produces monocrystalline silicon bodies wherein at least a major portion of the volume below the layer of crystalline silicon has been etched away, effectively isolating the silicon layer from the rest of the silicon body. An etching process according to the present invention may also be used to fabricate a silicon body having a single macrocavity with an overhanging layer of crystalline silicon, with the macrocavity occupying a major portion of the planar area beneath the surface of the silicon body.

DETAILED DESCRIPTION

Figure 1:
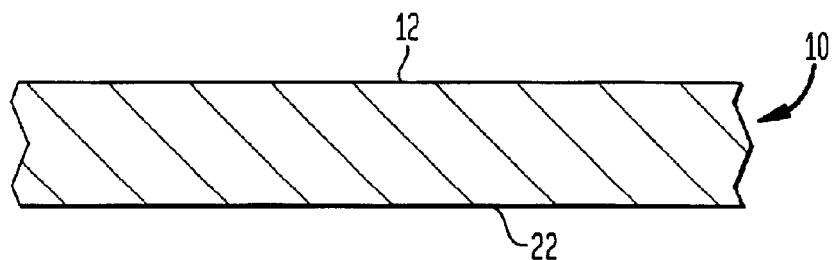
FIGS. 1–4 are fragmentary diagrammatic sectional views of a silicon element at progressively later stages of treatment in a manufacturing process according to an embodiment of the present invention.
Figure 2:
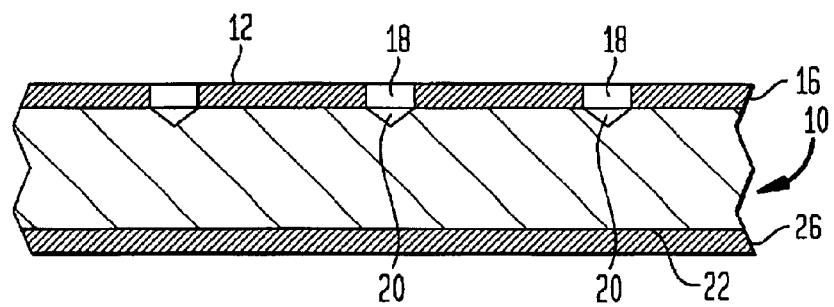
Figure 3:
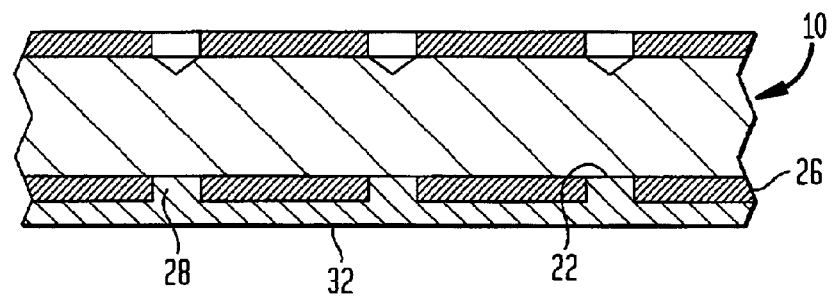

A preferred process, according to one aspect of the present invention, for fabricating a microchannel plate from a p-type silicon wafer begins with providing a p-type silicon element such as a substantially monocrystalline p-doped silicon wafer 10 having a front surface 12 and a rear surface 22. Front surface 12 is oxidized or nitrided to form a front surface layer 16. A pattern is transferred into front surface layer 16 using standard photolithographic techniques. The pattern may consist of any desired arrangement of circular or other shaped holes or apertures 18. The pattern of holes, for example, may be a square array of 30 μm diameter circular holes arranged on 300 μm centers. The number and location of holes may be determined by the number and size of the desired macrocavities. Silicon elements with as few as one cavity may be produced. The pattern of holes is transferred to the silicon oxide/nitride surface by coating the surface with a photoresist (not shown), properly curing the photoresist, and then exposing the photoresist-covered surface with an appropriate light source that has passed through a photolithographic mask containing the desired pattern of openings. The photoresist is then developed, and the oxide or nitride layer is then etched using either wet or dry etching techniques to expose the underlying silicon substrate. The photoresist mask may then be removed. The silicon substrate is then etched in a separate step to form depressions or pits 20 in the silicon exposed by the opening 18 in layer 16. Pits 20 serve as preferential etch sites during the electrochemical etching process. A preferred method for making these depressions is to anisotropically etch the silicon in a solution of potassium hydroxide to produce an array of pyramidal pits in the <100> silicon surface having the same periodicity as the pattern on the photolithographic mask. The silicon oxide/nitride layer 16 may then be removed. Preferably, the resulting pits have relatively large, open ends at the front surface 12 and relatively small ends pointing into the silicon element toward the rear surface 22.

A patterned electrode is provided to establish electrical contact with discrete regions of back surface 22. Preferably, at least some of these regions are aligned with at least some of the pits 20 in front surface 12. Preferably, patterned electrode 32 is formed on the back surface of the wafer 10. More preferably, back surface 22 is oxidized or nitrided to form back surface layer 26, and openings 28 are created within the oxide/nitride layer, exposing back surface 22 within discrete regions of back surface layer 26. The same photolithographic techniques may be used to create a pattern of openings in back surface layer 26 as were used to create openings in front surface layer 16. Preferably, the pattern consists of openings 28 which are aligned with openings 18 in front surface layer 16. The pattern may be transferred and the exposed oxide/nitride areas etched as described above. In contrast to the method of preparing front surface layer 16, it is preferred that back surface layer 16 not be subjected to an anisotropic etch. The back side of the wafer 10 is then implanted with boron to produce a heavily doped region near back surface 22 of wafer 10. Following boron implantation, metal is deposited onto back surface layer 26 to form the patterned electrode 32. This metallization step may comprise evaporating aluminum metal onto back surface layer 26 and openings 28 and providing a consolidating heat treatment at temperatures of about 400° C. to about 480° C. to form a good low-resistance contact with wafer 10 at regions 28. 24 The wafer 10 is then placed into an electrochemical cell with front surface 12 facing into the cell cavity. The ratio of the exposed surface area of the silicon wafer 10 to the exposed surface area of the counter-electrode 34 may be from about 0.2 to about 100. The cell has a platinum cathode or counter-electrode 34, and silicon wafer 10 serves as the anode. The cell is filled with an aqueous electrolyte 36 containing fluoride and desirably having a pH of about 1 to about 7, more desirably between about 3 and about 4. The fluoride concentration desirably is about 0.25 to about 5 M. The electrolyte may consist essentially of HF and water, and a surfactant. More preferably, the electrolyte includes an acid other than HF and a fluoride salt, with or without a surfactant. Inorganic acids and salts are preferred. The preferred inorganic acids include HCl, $H_2SO_4$ and $H_3PO_4$, whereas the preferred inorganic fluoride salts include $NH_4F$ and flouroborate salts such as $NH_4BF_4$, and $HBF_4$. The surfactant may be anionic, cationic or nonionic. Suitable surfactants include ethanol, formaldehyde and the material sold under the trademark Triton X-100. The surfactant is added in an amount effective to promote wetting of the silicon surface by the electrolyte. Aqueous electrolytes and etchants disclosed in commonly assigned U.S. Pat. No. 5,997,713, the disclosure of which is incorporated by reference, are suitable for use in preferred processes of the present invention.

The wafer 10 is biased to a positive voltage relative to counter-electrode 34. The cell is operated at initial voltages in excess of 5 volts up to as much as 25 volts. The cell is operated in a current-controlled mode so that as the cell impedance decreases, the voltage also decreases so as to maintain the electrochemical current density near a constant value. Preferably, the cell is initially biased to produce an electrochemical current density on the order of 20 times larger than the current densities typically employed in ordinary anodic etching of p-type silicon as practiced, for example, in commonly owned U.S. Pat. No. 5,997,713. More preferably, the current density is maintained at a value between 0.05 and 0.9 amps/cm$^2$ based on the area of the exposed silicon surface without considering any increase in surface area due to the presence of pits or cavities. Most preferably, the current density is maintained at a value of about 0.4 amps/cm$^2$. Under the preferred conditions, the electrochemical cell operates at higher voltages than are normally employed to etch p-type silicon. The largest voltage drop occurs at the silicon-electrolyte interface, so that electrons entering the silicon during removal of a silicon atom from the surface of the cavity are injected into the body of the silicon element with an excess kinetic energy. These energized electrons then produce impact ionization that locally accelerates the etching process.

Under the preferred operating conditions, a nearly isotropic etching proceeds from the tip of etch pit 20 in contact with the etchant 36. The etch front propagates parallel to the front surface 12, causing lateral expansion of the cavity, e.g., from sidewall location 46a to sidewall location 46, and towards the back surface 22 causing extension of the cavity, e.g., from back wall location 44a to back wall location 44. Expansion toward front surface 12 is negligible, resulting in formation of an overhanging layer 42 of monocrystalline silicon. These movements of the etch front appear to occur because the regions from which current can originate are limited to those regions where electrode 32 contacts back surface 22. The electrons are swept to these contact points by the applied electric field, preventing the etch front from propagating toward front surface 12. The use of a patterned electrode 32 also induces a higher operating voltage for a given current density relative to the voltage required for a wafer having an electrode in contact with the entire back surface 22. As the cavity enlarges, the voltage on the cell decreases due to the increasing surface area being etched.

Figure 4:
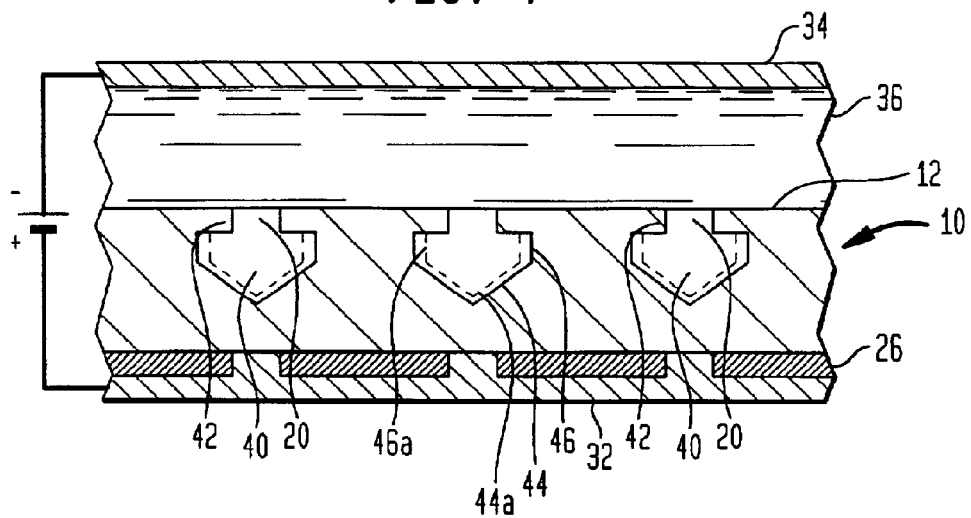
Figure 5:
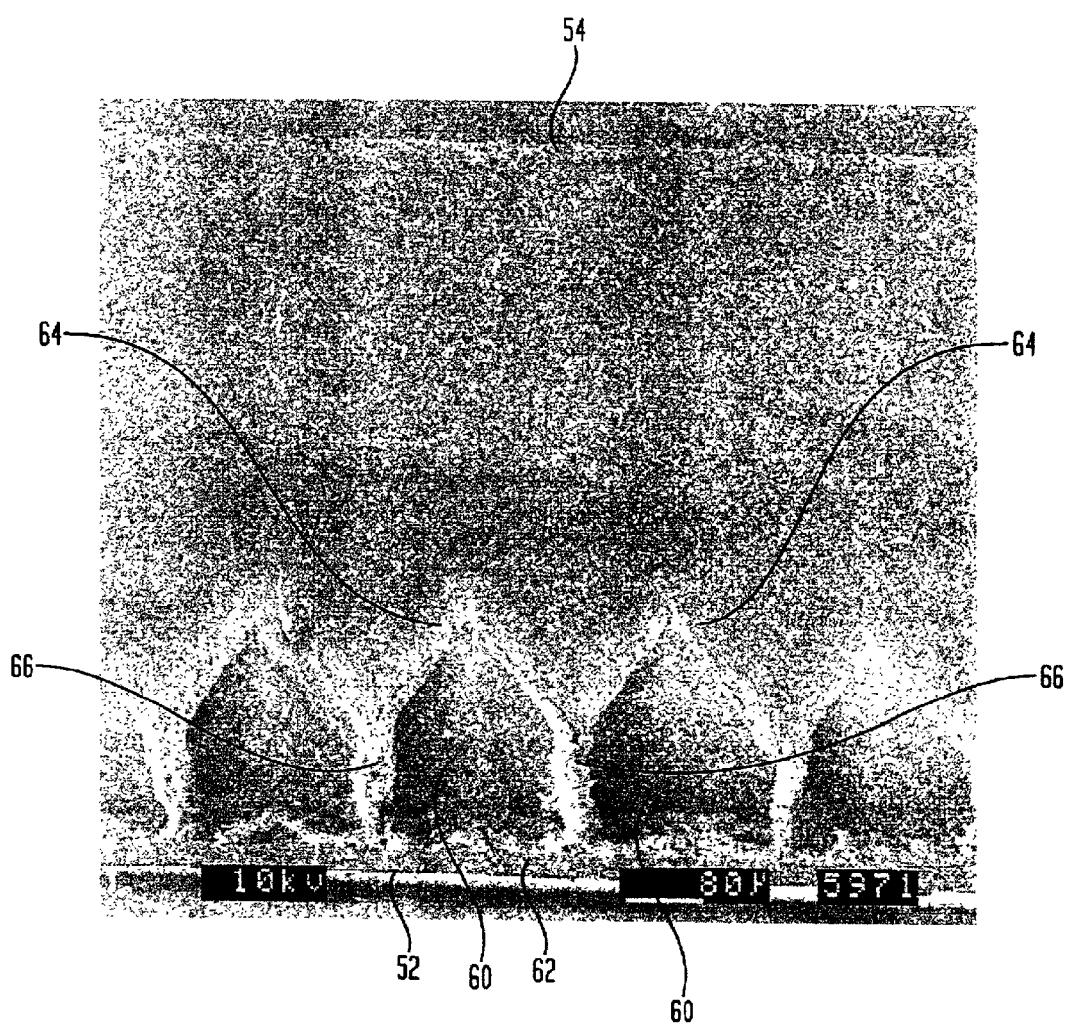
FIG. 5 is a microphotographic sectional view at 125× magnification of a silicon element etched according to an embodiment of the invention.

Etching processes according to preferred embodiments of the invention lead to the etching effects shown in FIG. 5 which shows the front surface 52 of the silicon element, the overhanging layer of monocrystalline silicon 62, macroscopic cavities 60 and wafer back side 54. Back wall 64 and side walls 66 of cavities 60 are also shown. The openings in front surface 52, similar to openings 20 in front surface 12 shown in FIG. 4, are not visible in the cross-section of FIG. 5.

The thickness of overhanging silicon layer 62 is substantially uniform across the planar area occupied by macrocavities 60. The thickness of overhanging layer 62 may be controlled by the initial depth of pit 20, which will be approximately the same as the diameter of the opening 18. This effect appears to be determined by the geometry of the silicon crystal. When the exposed surface of the silicon element is a <100> surface of the crystal, the caustic anisotropic etch produces a pit that has a sloping wall along the <111> plane, i.e., 54 degrees off the vertical plane relative to the exposed surface, and is, therefore, approximately as deep as opening 18 is wide. Since etching proceeds most rapidly along the <100> plane, the etching front moves parallel to front surface 12, resulting in an overhanging layer 62 that has a thickness roughly equivalent to the initial depth of pit 20.

Under preferred embodiments of the etching process, the extent of the lateral expansion of the macrocavities is self-limiting. The final thickness of sidewall 66 between adjacent cavities 60 is about two to three times the diameter of the opening for the illustrative sample presented herein. The ratio of wall thickness to the diameter of the opening in the front surface of the silicon body can be controlled by altering the resistivity of the silicon element, higher resistivity resulting in a greater final thickness of sidewall 66. The back wall 64 of cavity 60 continues to move toward back surface 54 after lateral expansion ceases. The lateral extent of the cavities is limited by the spacing of the openings in front surface 52 and the thickness of sidewalls 66.

The self-limiting nature of the lateral expansion creates sidewalls that effectively isolate adjacent macrocavities from each other. The resulting macrocavity is physically isolated from the adjacent cavities and communicates with the exterior of the silicon element only through the initial opening etched in the front surface 52. The pyramidal shape of back walls 64 apparently is controlled by the geometry of the crystal as discussed with regard to pits 20.

In another preferred aspect of the invention, a single pit is etched into front surface 12 of silicon body 10. Electrode 32 is provided to establish electrical contact within a discrete region of back surface 22, preferably aligned with the pit formed in front surface 12. The etching process proceeds as described herein, resulting in a silicon body 10 having a single macrocavity with an overhanging layer of crystalline silicon. Operating conditions of current density and duration, and the resistivity of silicon body 10, are selected to control the extent of etching. These conditions may be adjusted to produce a silicon body in which the macrocavity occupies a major portion of the planar area beneath the front surface 12.

According to other preferred aspects of the invention, the electrolyte may be a non-aqueous electrolyte such as anhydrous acetonitrile with tetrabutylammonium perchlorate and hydrogen fluoride. Other non-aqueous electrolytes such as dimethylformamide, dimethylsulfoxide, diethylene glycol, propylene carbonate, methylene chloride and the like may be employed. Sources of fluoride ions other than HF may also be employed in the non-aqueous electrolyte. Tetrabutyl ammonium perchlorite may be added to increase the electrical conductivity of the electrolyte. Other additives may be employed for the same purpose. Several non-limiting examples of non-aqueous electrolytes that are suitable for use with the present invention are disclosed in commonly assigned U.S. Pat. No. 5,997,713. When using a non-aqueous electrolyte, it is important to keep the residual amount of water in the solution low, i.e., at less than 100 ppm. Preferably, initial current densities in accordance with the present invention will be on the order of 20 times as great as those disclosed in the examples of U.S. Pat. No. 5,987,713.

The etching processes discussed above are light-insensitive. The processes do not depend upon the presence of light for operation, and can be conducted in essentially any lighting conditions, including the complete absence of light or normal room lighting. Although some holes may be formed in the p-doped silicon by incident light, such holes are insignificant in comparison to the number of holes present as a result of p-doping.

The following non-non-limiting example describes the conditions under which the etching effects shown in FIG. 5 were produced:

A 200 mm diameter silicon wafer was patterned with 30 micron openings on 300 micron centers using conventional semiconductor processing techniques.

The patterned silicon was then subjected to an isotropic KOH etch to produce a pyramidally-shaped depression in the silicon surface. The masking layer on the front surface of the wafer was then removed. A pattern of 30 micron openings on 300 micron centers was patterned on the back surface of the wafer, also using conventional semiconductor processing techniques, with the pattern array aligned to the pattern on the front side of the wafer. The back side of the wafer was then implanted with boron in the patterned area, and the wafer back side was metallized and given a consolidating heat treatment at about 400° C. The wafer was placed in an electrochemical cell containing the following electrolytes and operating at the specified voltages and current density. The silicon wafer was biased to a positive potential relative to a platinum wire cathode.

| 1. Electrolyte | |
|---|---|
| $NH_4F$ (40 wt % aqueous solution) | 700 ml |
| HCl (36.5 wt % aqueous solution) | 300 ml |
| $H_2O$ | 2100 ml |
| 2. Cell Operating Conditions | |
| Initial: 18 mA at 25 V | |
| Final: 18 mA, 1 V | |
| Duration: 4 hours | |

Typical etch rates under these conditions are 100 to 150 microns per hour.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming macroscopic cavities within the body of a silicon element comprising the steps of:
   (a) providing a p-doped silicon element having a front surface and a back surface;
   (b) forming a plurality of pits in the front surface of the silicon element;
   (c) providing a patterned electrode in electrical contact with the silicon element within discrete regions of said back surface; and
   (d) maintaining the front surface of the silicon element and a counter-electrode in contact with an electrolyte, the silicon element having a positive potential with respect to the counter-electrode, while maintaining an electrochemical current density between the silicon element and the counter-electrode.

2. A method as claimed in claim 1 wherein said electrolyte is an aqueous electrolyte.

3. A method as claimed in claim 2 wherein said aqueous electrolyte includes fluoride ions and has a pH of about 1 to about 7.

4. A method as claimed in claim 3 wherein said aqueous electrolyte has a fluoride concentration of about 0.25 to about 5 M.

5. A method as claimed in claim 3 wherein said aqueous electrolyte includes HF, another acid, and a fluoride salt.

6. A method as claimed in claim 5 wherein said fluoride salt is selected from the group consisting of fluoroborate salts.

7. A method as claimed in claim 5 wherein said fluoride salt is $NH_4F$.

8. A method as claimed in claim 3 wherein said electrolyte includes HCl and $NH_4F$.

9. A method as claimed in claim 3 wherein said aqueous electrolyte includes a surfactant.

10. A method as claimed in claim 1 wherein said electrolyte is a non-aqueous electrolyte.

11. A method as claimed in claim 10 wherein said non-aqueous electrolyte includes less than about 100 parts per million water by weight.

12. A method as claimed in claim 1 wherein said step of forming said pits includes selecting locations on said front surface and then forming said pits at said locations, and wherein at least some of said discrete regions are aligned with at least some of said plurality of pits.

13. A method as claimed in claim 12 wherein said step of forming said plurality of pits includes the step of forming a layer of a silicon oxide or silicon nitride on said front surface, forming openings in said layer at said locations, and anisotropically etching the silicon in said element through said openings.

14. A method as claimed in claim 1 wherein said pits taper from a relatively wide area at said front surface to a relatively narrow area beneath said front surface.

15. A method as claimed in claim 1 wherein said step of providing a patterned electrode on the back surface of the silicon element comprises forming a layer of a silicon oxide or silicon nitride on said back surface, forming openings in said layer within said discrete regions, and metallizing said back surface.

16. A method as claimed in claim 15 wherein said step of providing a patterned electrode includes implanting boron beneath said back surface within said discrete regions.

17. The method of claim 1 wherein said initial positive potential is between +5 volts and +25 volts.

18. The method of claim 1 wherein said electrochemical current density is maintained between 0.05 and 0.9 amps/cm$^2$ of surface area of said front surface.

19. The method of claim 1 wherein said electrochemical current density is maintained between 0.2 and 0.6 amps/cm$^2$ of surface area of said front surface.

20. The method of claim 1 wherein said electrochemical current density is maintained at about 0.4 amps/cm$^2$ of surface area of said front surface.

21. A method of forming a macroscopic cavity within the body of a silicon element comprising the steps of:
    (a) providing a p-doped silicon element having a front surface and a back surface;
    (b) forming at least one pit in the front surface of the silicon element;
    (c) providing an electrode in electrical contact with the silicon element within at least one discrete region of said back surface; and
    (d) maintaining the front surface of the silicon element and a counter-electrode in contact with an electrolyte, the silicon element having a positive potential with respect to the counter-electrode, while maintaining an electrochemical current density between the silicon element and the counter-electrode.

22. A method as claimed in claim 21 wherein at least one of said at least one discrete region is aligned with said at least one pit.

23. A method as claimed in claim 22 wherein said step of forming said at least one pit includes the step of forming a layer of a silicon oxide or silicon nitride on said front surface, forming at least one opening in said layer, and anistropically etching the silicon in said element through said at least one opening.

24. A method as claimed in claim 21 wherein said step of providing said electrode on the back surface of the silicon element comprises forming a layer of a silicon oxide or silicon nitride on said back surface, forming at least one opening in said layer within said discrete region, and metallizing said back surface.

25. A method as claimed in claim 24 wherein said step of providing said electrode includes implanting boron beneath said back surface within said discrete region.

26. A p-doped monocrystalline silicon body having a front surface, a rear surface, a plurality of macroscopic cavities within said body and a layer of crystalline silicon adjacent to said front surface, said layer of crystalline silicon overlying at least some of said plurality of macroscopic cavities, said macroscopic cavities and said layer of crystalline silicon being formed by an electrochemical etching process, said process comprising the steps of:
    (a) providing said p-doped silicon body;
    (b) forming a plurality of pits in the front surface of the silicon body;
    (c) providing a patterned electrode in electrical contact with the silicon element within discrete regions of said back surface; and
    (d) maintaining the front surface of the silicon element and a counter-electrode in contact with an electrolyte, the silicon element having a positive potential with respect to the counter-electrode, while maintaining an electrochemical current density between the silicon element and the counter-electrode.

27. The p-doped monocrystalline silicon body of claim 26 wherein at least some of said discrete regions are aligned with at least some of said plurality of pits.

28. A p-doped monocrystalline silicon body having a front surface, a rear surface, at least one macroscopic cavity within said body and a layer of crystalline silicon adjacent to said front surface, said layer of crystalline silicon overlying at least one macroscopic cavity, said at least one macroscopic cavity and said layer of crystalline silicon being formed by an electrochemical etching process, said process comprising the steps of:
    (a) providing said p-doped silicon body;
    (b) forming at least one pit in the front surface of the silicon body;
    (c) providing an electrode in electrical contact with the silicon element within at least one discrete region of said back surface; and
    (d) maintaining the front surface of the silicon element and a counter-electrode in contact with an electrolyte, the silicon element having a positive potential with respect to the counter-electrode, while maintaining an electrochemical current density between the silicon element and the counter-electrode.

29. The p-doped monocrystalline silicon body of claim 28 wherein said at least one discrete region is aligned with said at least one pit.

30. A p-doped monocrystalline silicon body having a front surface, a plurality of macroscopic cavities within said body, a layer of crystalline silicon adjacent to said front surface, said layer of crystalline silicon overlying at least some of said cavities, and a plurality of openings within said front surface, each cavity of said plurality of macroscopic cavities being in communication with said front surface by means of at least one of said plurality of openings.

31. The p-doped monocrystalline silicon body of claim 30 wherein said layer of crystalline silicon has a substantially uniform thickness throughout the planar area of said layer overlying said at least some of said cavities, said thickness being the distance from said front surface to a surface of said layer exposed to said at least some of said cavities.

32. The p-doped monocrystalline body of claim 31 wherein said thickness of said crystalline silicon layer is substantially the same as a width of said opening in said front surface, said width being the distance from one side of said opening to an opposed side of said opening in the plane of said front surface.

33. The p-doped monocrystalline silicon body of claim 30 wherein, within at least a part of said body, said plurality of macroscopic cavities occupy an aggregate planar area comprising at least 50% of the planar area of said front surface.

34. The p-doped monocrystalline silicon body of claim 33 wherein, within said at least a part of said body, said plurality of macroscopic cavities occupy an aggregate planar area comprising at least 90% of the planar area of said front surface.

35. The p-doped monocrystalline silicon body of claim 30 wherein said silicon body has a back surface and at least one of said plurality of macroscopic cavities has a front wall proximate to said layer of crystalline silicon, a back wall opposed to said front wall of said at least one of said plurality of cavities, and a side wall that separates said at least one of said plurality of macroscopic cavities from at least one other of said plurality of macroscopic cavities, said back surface of said at least one of said plurality of cavities being closed with respect to said back surface of said silicon body and said side wall being closed with respect to said at least one other of said plurality of cavities.

36. The p-doped monocrystalline body of claim 35 wherein said back wall of said at least one of said plurality of macroscopic cavities has a pyramidal shape.

37. A p-doped monocrystalline silicon body having a front surface, at least one macroscopic cavity within said body and a layer of crystalline silicon adjacent to said front surface, said layer of crystalline silicon overlying said at least one cavity, and at least one opening within said front surface, said at least one cavity being in communication with said front surface by means of said at least one opening.

38. The p-doped monocrystalline silicon body of claim 37 wherein said layer of crystalline silicon has a substantially uniform thickness throughout the planar area of said layer overlying said at least one cavity, said thickness being the distance from said front surface to a surface of said layer exposed to said at least one cavity.

39. The p-doped monocrystalline body of claim 38 wherein said thickness of said crystalline silicon layer is substantially the same as a width of said at least one opening in said front surface, said width being the distance from one side of said opening to an opposed side of said opening in the plane of said front surface.

40. The p-doped monocrystalline silicon body of claim 37 wherein, within at least a part of said body, said at least one macroscopic cavity occupies an aggregate planar area comprising at least 50% of the planar area of said front surface.

41. The p-doped monocrystalline silicon body of claim 40 wherein, within at least a part of said body, said at least one macroscopic cavity occupies an aggregate planar area comprising at least 90% of the planar area of said front surface.

* * * * *